United States Patent
Zeng

(10) Patent No.: US 12,406,856 B2
(45) Date of Patent: Sep. 2, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Yizhi Zeng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 359 days.

(21) Appl. No.: 18/150,265

(22) Filed: Jan. 5, 2023

(65) Prior Publication Data

US 2023/0411166 A1  Dec. 21, 2023

(30) Foreign Application Priority Data

Jun. 21, 2022  (CN) .......................... 202210703726.6

(51) Int. Cl.
| | |
|---|---|
| H01L 21/311 | (2006.01) |
| H01L 21/02 | (2006.01) |
| H01L 21/3205 | (2006.01) |
| H01L 21/3213 | (2006.01) |
| H10B 12/00 | (2023.01) |

(52) U.S. Cl.
CPC .... *H01L 21/31144* (2013.01); *H01L 21/0214* (2013.01); *H01L 21/02164* (2013.01); *H01L 21/02266* (2013.01); *H01L 21/0228* (2013.01); *H01L 21/32055* (2013.01); *H01L 21/32139* (2013.01); *H10B 12/033* (2023.02)

(58) Field of Classification Search
None
See application file for complete search history.

(56) References Cited

U.S. PATENT DOCUMENTS

| | | | |
|---|---|---|---|
| 2008/0220611 A1* | 9/2008 | Jeon ............... | H01L 21/0337 257/E21.232 |
| 2010/0136790 A1* | 6/2010 | Chang ............. | H01L 21/0337 438/694 |
| 2012/0009787 A1 | 1/2012 | Kim | |
| 2018/0138040 A1* | 5/2018 | LaVoie ........... | C23C 16/042 |

FOREIGN PATENT DOCUMENTS

CN 102315119 A 1/2012

* cited by examiner

*Primary Examiner* — Stephanie P Duclair
(74) *Attorney, Agent, or Firm* — Kilpatrick Townsend & Stockton LLP

(57) ABSTRACT

The present disclosure provides a method of manufacturing a semiconductor structure and a semiconductor structure, and relates to the technical field of semiconductors. The method of manufacturing a semiconductor structure includes: providing a base; forming a first dielectric layer having grooves, where the grooves include a first groove and a second groove whose inner diameters have a first difference; forming an initial filling layer in the first groove and the second groove, where the first groove forms a third groove, the second groove forms a fourth groove, and an inner diameter of the third groove and that of the fourth groove have a second difference less than the first difference; processing the initial filling layer to form a filling layer; and forming a plurality of etching openings whose inner diameters have a preset difference on a surface of the base.

13 Claims, 8 Drawing Sheets

METHOD OF MANUFACTURING SEMICONDUCTOR STRUCTURE AND SEMICONDUCTOR STRUCTURE

CROSS-REFERENCE TO RELATED APPLICATION

This application claims the priority of Chinese Patent Application No. 202210703726.6, submitted to the Chinese Intellectual Property Office on Jun. 21, 2022, the disclosure of which is incorporated herein in its entirety by reference.

TECHNICAL FIELD

The present disclosure relates to the technical field of semiconductors, and in particular, to a method of manufacturing a semiconductor structure and a semiconductor structure.

BACKGROUND

A dynamic random access memory (DRAM) is a semiconductor memory that randomly writes and reads data at a high speed, and is widely used in data storage devices or apparatuses.

With the continuous development of DRAM process technologies, a feature dimension, such as a critical dimension (CD) of an active region, of a semiconductor structure in an integrated circuit, is also decreasing. In addition, when semiconductor structures with smaller CDs are manufactured, local CD uniformity (LCDU) is excessively low, adversely affecting the electrical performance of the semiconductor structures.

SUMMARY

An overview of the subject matter detailed in the present disclosure is provided below, which is not intended to limit the protection scope of the claims.

The present disclosure provides a method of manufacturing a semiconductor structure and a semiconductor structure.

A first aspect of the present disclosure provides a method of manufacturing a semiconductor structure. The method of manufacturing a semiconductor structure includes:
  providing a base;
  forming a first dielectric layer on the base, where the first dielectric layer is provided with grooves arranged in an array, the grooves include a first groove and a second groove, and an inner diameter of the first groove and that of the second groove have a first difference;
  forming an initial filling layer, where the initial filling layer covers a sidewall and a bottom wall of the first groove and covers a sidewall and a bottom wall of the second groove, the initial filling layer in the first groove forms a third groove, the initial filling layer in the second groove forms a fourth groove, an inner diameter of the third groove and that of the fourth groove have a second difference, and the second difference is less than the first difference;
  processing the initial filling layer to form a filling layer; and
  etching the filling layer and/or the first dielectric layer, to form a plurality of etching openings whose inner diameters have a preset difference on a surface of the base.

A second aspect of the present disclosure provides a semiconductor structure, which is manufactured by using the method of manufacturing a semiconductor structure according to any one of the foregoing embodiments.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A DRAM is a semiconductor memory that randomly writes and reads data at a high speed, and is widely used in data storage devices or apparatuses.

With the continuous development of DRAM process technologies, a feature dimension, such as a CD of an active region, of a semiconductor structure in an integrated circuit, is also shrinking. In addition, when semiconductor structures with smaller CDs are manufactured, LCDU is excessively low, leading to different local CDs of subsequently formed semiconductor structures. In a process of forming through holes (where the through holes may form a contact structure, a capacitor structure, or the like) in the semiconductor structure, sizes of mask patterns formed in a mask are not exactly the same, and the uniformity is poor. The sizes are normally distributed by the limitation of a mask manufacturing process. Sizes of most of mask holes in the mask pattern satisfy a requirement of a subsequent etch processing. However, some of the mask holes have width inner diameters or inner diameter sizes that greatly differ from a target size, and such mask holes may lead to the formation of laps between the subsequently formed semiconductor structures (such as bit line contacts), adversely affecting the electrical performance of the semiconductor structures.

To resolve one of the foregoing technical problems, an exemplary embodiment of the present disclosure provides a method of manufacturing a semiconductor structure. The following describes the method of manufacturing a semiconductor structure with reference to FIG. 1 to FIG. 13.

The semiconductor structure is not limited in this embodiment. The semiconductor structure is described below by using a DRAM as an example, but this embodiment is not limited thereto, and the semiconductor structure in this embodiment may also be other structures.

Figure 1:
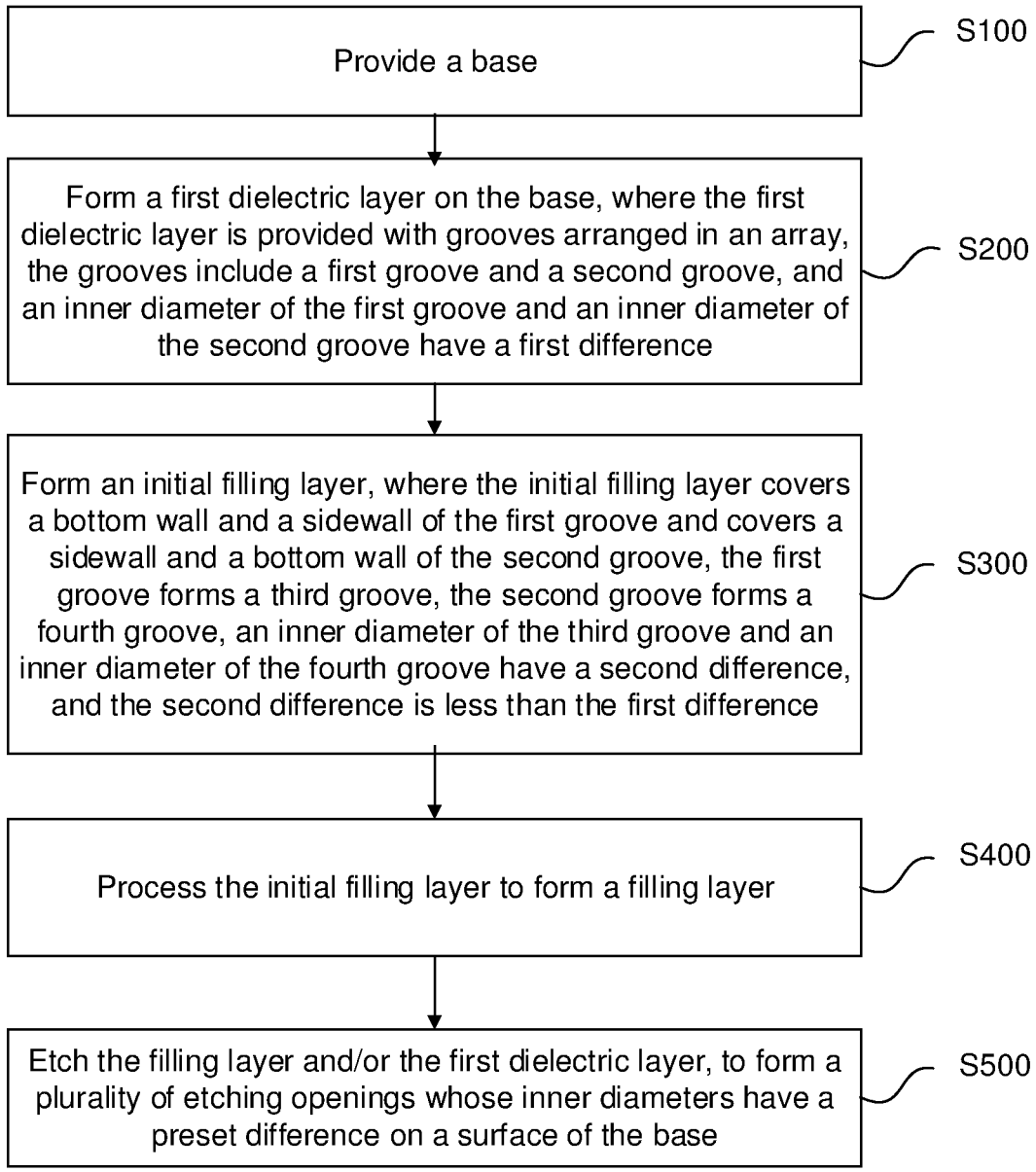
FIG. 1 is a flowchart of a method of manufacturing a semiconductor structure according to an exemplary embodiment.

As shown in FIG. 1, an exemplary embodiment of the present disclosure provides a method of manufacturing a semiconductor structure, including:

Step S100: Provide a base.

Step S200: Form a first dielectric layer on the base, where the first dielectric layer is provided with grooves arranged in an array, the grooves include a first groove and a second groove, and an inner diameter of the first groove and that of the second groove have a first difference.

Step S300: Form an initial filling layer, where the initial filling layer covers a bottom wall and a sidewall of the first groove and covers a sidewall and a bottom wall of the second groove, the first groove forms a third groove, the second groove forms a fourth groove, an inner diameter of the third groove and that of the fourth groove have a second difference, and the second difference is less than the first difference.

Step S400: Process the initial filling layer to form a filling layer.

Step S500: Etch the filling layer and/or the first dielectric layer, to form a plurality of etching openings whose inner diameters have a preset difference on a surface of the base.

Figure 2:
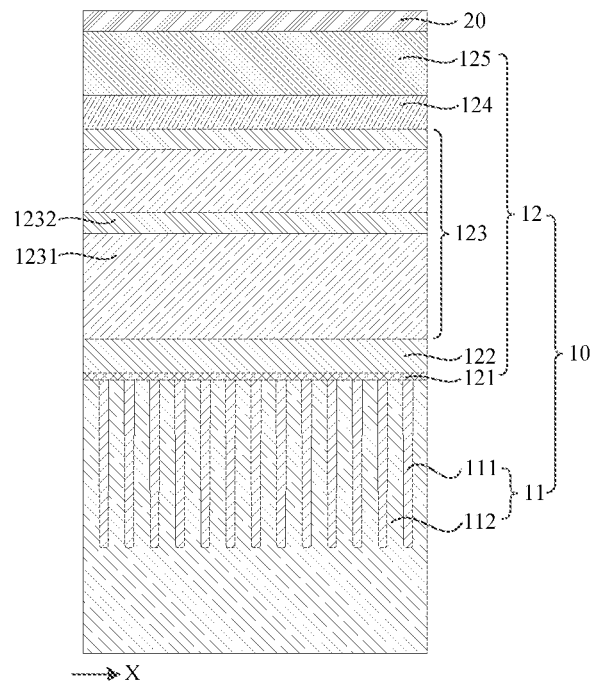
FIG. 2 is a schematic diagram of forming a first dielectric layer in a method of manufacturing a semiconductor structure according to an exemplary embodiment.

As shown in FIG. 2, in step S100, a base 10 serves as a support component of a DRAM and is configured to support other components provided thereon. The base 10 may be made of a semiconductor material. The semiconductor material may be one or more of silicon, germanium, a silicon-germanium compound, and a silicon-carbon compound. In this embodiment, the base 10 is made of silicon, to facilitate understanding of a subsequent forming method by those skilled in the art, rather than to constitute a limitation. In an actual application process, an appropriate material of the base may be selected as required.

Referring to FIG. 2, in step S200, a first dielectric layer 20 may be formed on a base 10 by using an atomic layer deposition process, a physical vapor deposition process, or a chemical vapor deposition process. A material of the first dielectric layer 20 may include but is not limited to silicon oxynitride or undoped polycrystalline silicon. To form another semiconductor structure (such as a bit line structure or a word line structure) on the first dielectric layer 20, an opening (not shown in the figure) needs to be formed on the first dielectric layer 20. For example, a mask layer (not shown in the figure), a photoresist (not shown in the figure), and the like are formed through deposition on the first dielectric layer 20, and then a plurality of openings arranged in an array are formed on the first dielectric layer 20 by using an etching processing process, where the first dielectric layer 20 between adjacent openings forms a mask structure 30.

Figure 4:
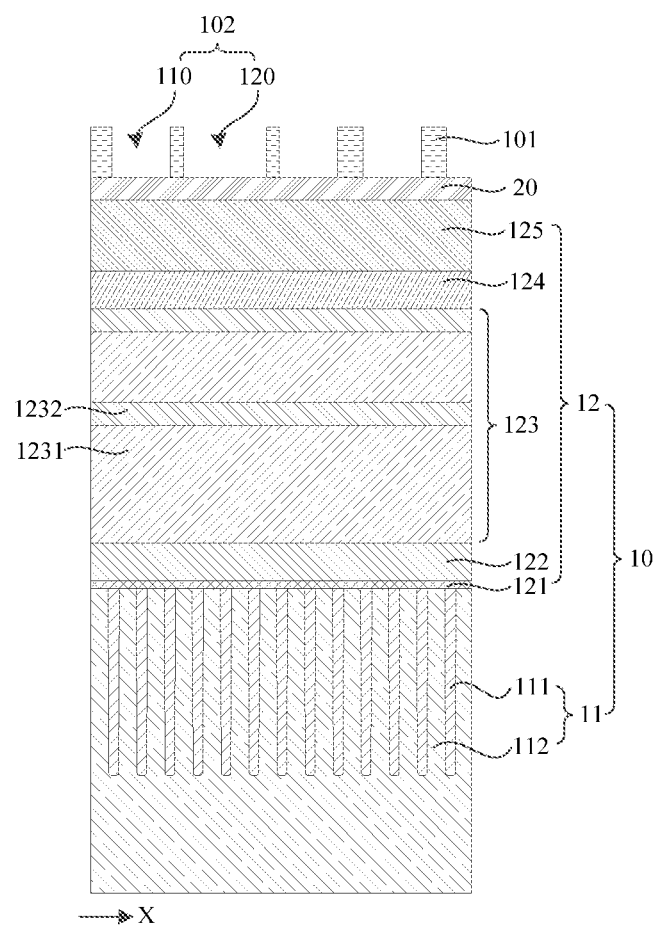
FIG. 4 is a schematic diagram of forming a fifth groove and a sixth groove in a method of manufacturing a semiconductor structure according to an exemplary embodiment.
Figure 5:
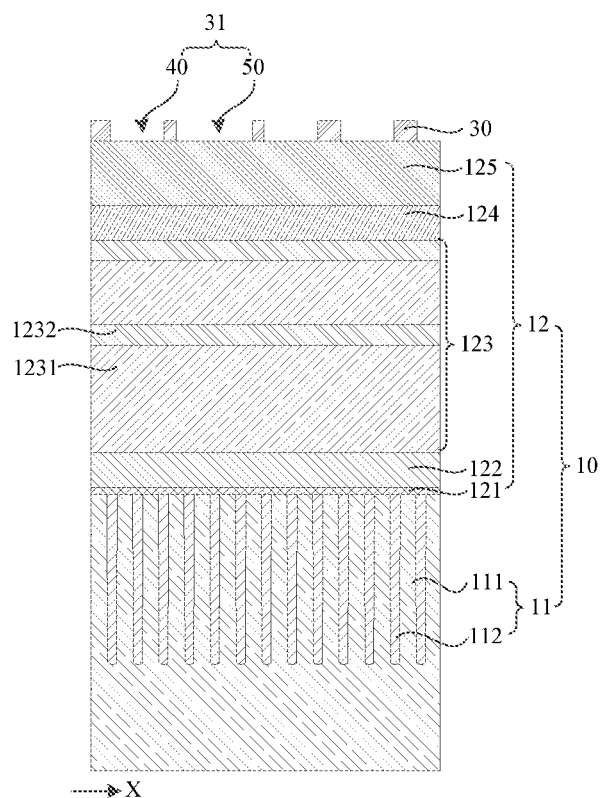
FIG. 5 is a schematic diagram of forming a first groove and a second groove in a method of manufacturing a semiconductor structure according to an exemplary embodiment.

Referring to FIG. 5, with reference to FIG. 4, grooves 31 arranged in an array are provided on the first dielectric layer 20. It should be noted that, a region between two adjacent mask structures 30 along a same row and/or a same column is a groove 31. The grooves 31 include a first groove 40 and a second groove 50. The first groove 40 may be a region between two adjacent mask structures 30 of some mask structures 30 in a same row and/or a same column, and the second groove 50 may be a region between two adjacent mask structures 30 of some mask structures 30 in a same row and/or a same column, where the first groove 40 and the second groove 50 are distributed in different regions on the first dielectric layer 20.

A plurality of mask structures 30 in a same column are defined to be provided at intervals along a first direction X. Referring to FIG. 2, an orientation shown in the figure is used as an example. The first direction is the direction X in FIG. 2, that is, the first direction X is parallel to a front side surface of the base 10. There may be a plurality of first grooves 40 and a plurality of second grooves 50 along the first direction X. In a process of forming the mask structures 30, sizes of the mask structures 30 along the first direction X are different, and therefore, an inner diameter of the first groove 40 is different from an inner diameter of the second groove 50. The inner diameter of the first groove 40 may be greater than or less than the inner diameter of the second groove 50.

Figure 3:
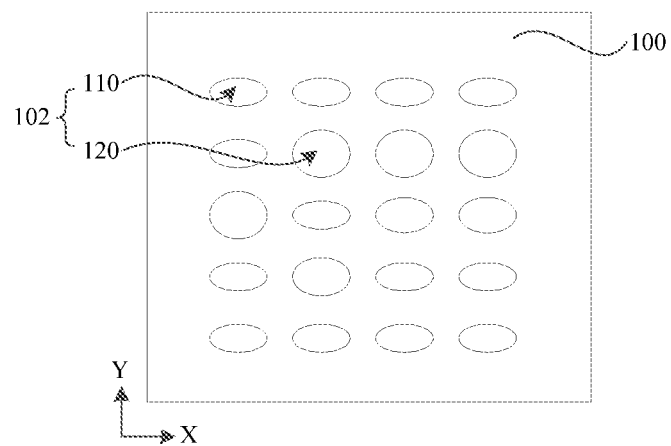
FIG. 3 is a top view of a first mask pattern in a method of manufacturing a semiconductor structure according to an exemplary embodiment.

The inner diameter may be a size, of the groove 31, measured in a same direction and is not limited to the first direction X and the second direction in FIG. 3, and for all of the grooves 31, diameters obtained through measurement in a same direction are inner diameters of the grooves 31. It should be noted that, the second direction is a direction Y in FIG. 3, that is, the second direction Y and the first direction X are perpendicular to each other, and the second direction Y is parallel to a left side surface or a right side surface of the base 10.

The inner diameter of the first groove 40 satisfies a requirement on a subsequently etching processing process; or the inner diameter of the second groove 50 satisfies a requirement on a subsequently etching processing process. In this embodiment and the embodiments described below, that the inner diameter of the second groove 50 is greater than the inner diameter of the first groove 40 is used as an example for description, and the inner diameter of the second groove 50 and the inner diameter of the first groove 40 have a first difference.

In another embodiment, referring to FIG. 3, the first dielectric layer 20 may further include a third initial groove, a fourth initial groove, and the like whose inner diameters are different from the inner diameter of the first groove 40 and that of the second groove 50 along the first direction X.

Figure 6:
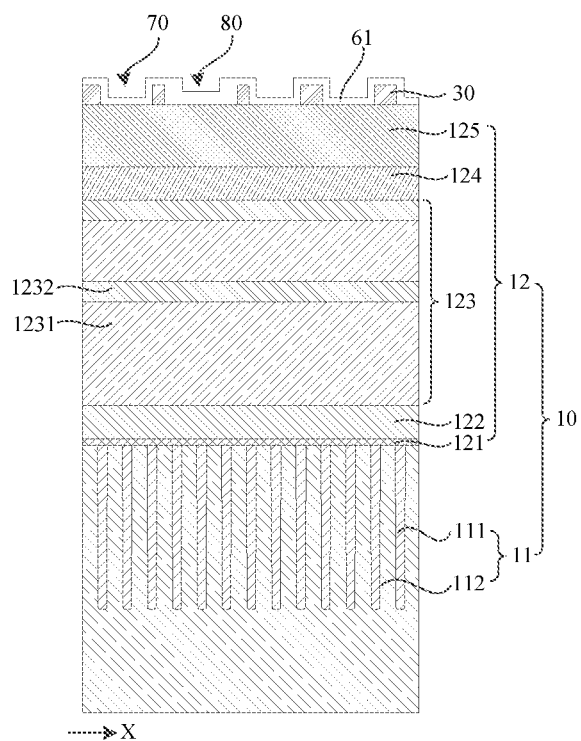
FIG. 6 is a schematic diagram of forming an initial filling layer in a method of manufacturing a semiconductor structure according to an exemplary embodiment.

Referring to FIG. 6, in step S300, the initial filling layer 61 may be formed through deposition in the first groove 40 and the second groove 50 by using an atomic layer deposition process, a chemical vapor deposition process, or a physical vapor deposition process. The initial filling layer 61 is deposited on a bottom wall and a sidewall of the first groove 40 and those of the second groove 50, and the initial filling layer 61 further covers a top surface of the mask structure 30.

It should be noted that, in the process of forming the initial filling layer 61 by using the deposition processes, a deposition parameter (such as a deposition rate, deposition time, or particle deposition energy) of a deposition material used for forming the initial filling layer 61 may be controlled, such that the deposition material used for forming the initial filling layer 61 forms part of the initial filling layer 61 whose deposition thickness is relatively thick on the bottom wall and the sidewall of the second groove 50, and forms part of the initial filling layer 61 whose deposition thickness is relatively thin on the bottom wall and the sidewall of the first groove 40.

After the initial filling layer 61 is formed through deposition, the initial filling layer 61 in the first groove 40 forms a third groove 70, and the initial filling layer 61 in the second groove 50 forms a fourth groove 80.

The inner diameter of the third groove 70 and the inner diameter of the fourth groove 80 have a second difference along the first direction X, where the second difference is less than the first difference. After the third groove 70 and the fourth groove 80 are formed, the inner diameter of the fourth groove 80 may be greater than the inner diameter of the third groove 70 or may be less than or equal to that of the third groove 70 along the first direction X.

Figure 7:
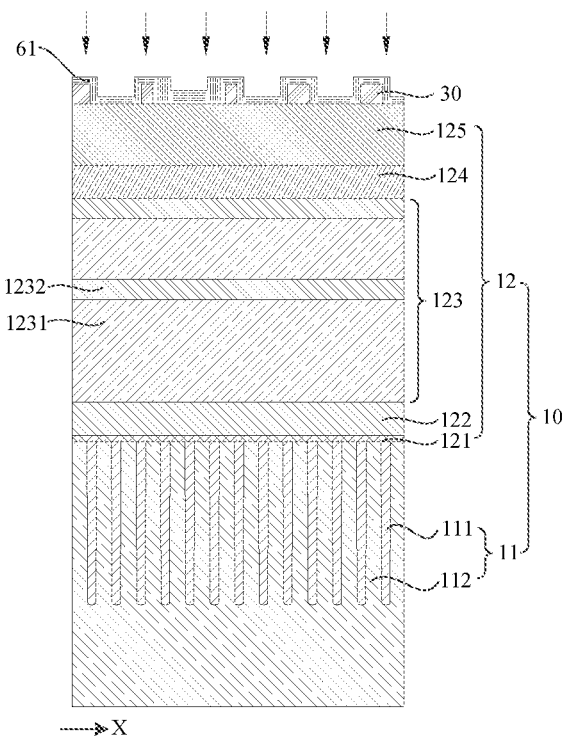
FIG. 7 is a schematic diagram of performing ion implantation on an initial filling layer in a method of manufacturing a semiconductor structure according to an exemplary embodiment.
Figure 8:
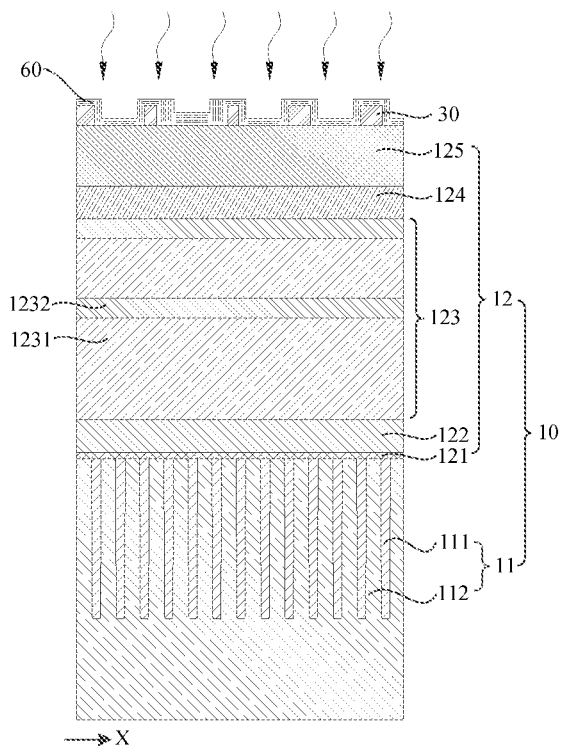
FIG. 8 is a schematic diagram of performing RTP on an initial filling layer in a method of manufacturing a semiconductor structure according to an exemplary embodiment.

Referring to FIG. 7 and FIG. 8, in step S400, the initial filling layer 61 is processed, to form a filling layer 60, so as to increase a rate for subsequent etching and reduce a production period of a semiconductor structure.

Figure 9:
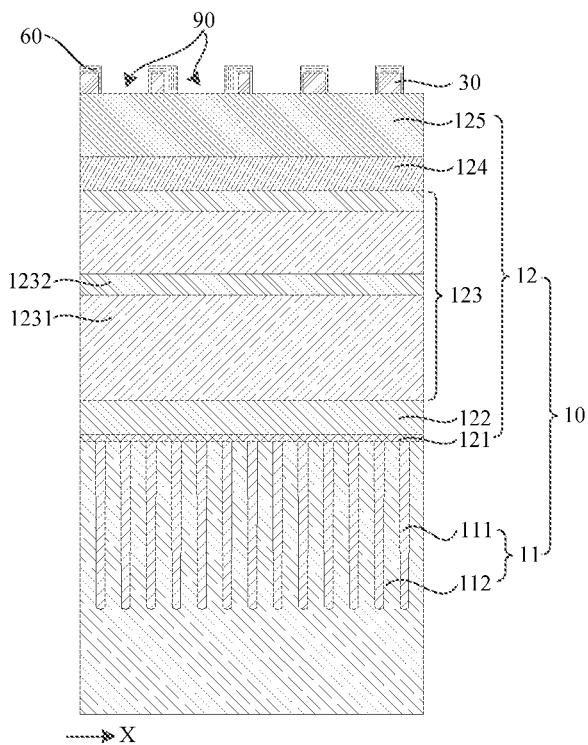
FIG. 9 is a schematic diagram of forming an etching opening in a method of manufacturing a semiconductor structure according to an exemplary embodiment.
Figure 10:
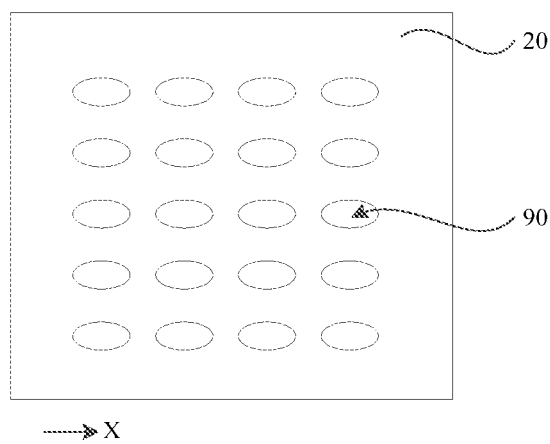
FIG. 10 is a top view of FIG. 9.

Referring to FIG. 9 and FIG. 10, in step S500, the filling layer 60 and/or the first dielectric layer 20 are etched by using an etching processing process, to a form a plurality of etching openings 90 whose inner diameters have a preset difference on a surface of the base 10. It should be noted that, the preset difference may be a difference satisfying a requirement on a subsequent etching processing process or an error operation range, and the preset difference may be 1 nm.

In this embodiment, a spacing between adjacent grooves is patched by using the initial filling layer, and the initial filling layer is processed, such that any subsequently formed etching opening can satisfy an etching process requirement, thereby effectively improving LCDU and an electrical property of the semiconductor structure.

Referring to FIG. 3, in some embodiments, the groove 31 has a target size, and the target size may be understood as a size satisfying the etching process requirement. The inner diameter of the first groove 40 is less than the target size, and the inner diameter of the second groove 50 is greater than the target size.

The target size is any value in a range of 30 nm to 60 nm. For example, the target size may be 30 nm, 35 nm, 40 nm, 45 nm, 50 nm, 55 nm, 60 nm, or the like. The inner diameter of the first groove 40 and that of the second groove 50 have a maximum difference of 6 nm, which is a difference allowable in a mask manufacturing process. If the maximum difference is greater than the difference, a manufactured mask does not satisfy a subsequent process requirement because the inner diameters have an excessively large difference.

Referring to FIG. 7 and FIG. 8, in some embodiments, the initial filling layer 61 may be processed by using the following method.

As shown in FIG. 7, ion implantation is performed on the initial filling layer 61. Group V elements may be selected and used to perform ion implantation on the initial filling layer 61. For example, a phosphorus (P) ion, an arsenic (As) ion, or the like in the group V elements is selected and used. Alternatively, group IV elements are selected and used to perform ion implantation on the initial filling layer 61. For example, a germanium (Ge) ion or the like in the group IV elements is selected.

In the process of performing ion implantation on the initial filling layer 61, a dose of ions implanted into the sidewall and the bottom wall of the fourth groove 80 is greater than a dose of ions implanted into the sidewall and the bottom wall of the third groove 70, that is, doses of ions implanted into different positions and different deposition thicknesses of the initial filling layer 61 are selectively changed, to affect subsequent etching rates of different positions and different deposition thicknesses of the filling layer 60, for example, in a subsequent etching processing process, an etching rate of the third groove 70 is 10% to 30% faster than an etching rate of the fourth groove 80 by using a same etching processing parameter, to effectively ensure that a size of a formed etching opening 90 is within a preset difference range.

As shown in FIG. 8, after an ion implantation process performed on the initial filling layer 61 ends, a RTP process is used to process the initial filling layer 61. RTP can effectively activate an ion implanted in the initial filling layer 61. An ion doping concentration in the fourth groove 80 is greater than an ion doping concentration in the third groove 70, such that the etching rate of the fourth groove 80 is slower and the etching rate of the third groove 70 is faster when the initial filling layer 61 is subsequently etched. In the etching process, parameters such as etching time and an etching gas may be appropriately controlled, such that the etching opening 90 whose inner diameter satisfies the target size required by the etching processing process is subsequently formed on the first dielectric layer 20 and/or the filling layer 60, thereby effectively resolving a problem that LCDU is excessively low in an etching process in the prior art and improving the electrical property of the semiconductor structure.

Referring to FIG. 7, in some embodiments, to effectively increase a subsequent etching rate in the semiconductor structure, group III elements may be alternatively used to perform ion implantation on the initial filling layer 61, for example, a boron ion (B) or the like in the group III elements is selected and used. Alternatively, group V elements may be used to perform ion implantation on the initial filling layer 61. For example, a P ion, an As ion, or the like in the group V elements is selected and used. In an example, when ion implantation is performed on the initial filling layer 61, an ion implantation dose is between $10^{14}/cm^2$ to $10^{15}/cm^2$, and ion implantation energy is between 10 KeV to 40 KeV.

For etching processing parameters, when an etching rate is 3 nm/min to 4 nm/min, and a deposition thickness of the first dielectric layer 20 is 20 nm to 30 nm, the B ion in the group III elements may be selected and used.

For etching processing parameters, when an etching rate is 4 nm/min to 5 nm/min, and a deposition thickness of the first dielectric layer 20 is 25 nm to 40 nm, the As ion in the group V elements may be selected and used.

For etching processing parameters, when an etching rate is 4 nm/min to 5 nm/min, and a deposition thickness of the first dielectric layer 20 is 30 nm to 50 nm, the P ion in the group V elements may be selected and used.

It should be noted that, after the ion in the group III elements or the group V elements is implanted into the initial filling layer 61, the dose of ions implanted into the sidewall and the bottom wall of the fourth groove 80 is greater than the dose of ions implanted into the sidewall and the bottom wall of the third groove 70.

In this embodiment, the ion in the group III elements or the ion in the group V elements is implanted into the initial filling layer. Doses of ions in the group III elements or the group V elements implanted into the different positions of the initial filling layer 61 are different, where an implantation dose in a region (to be specific, the bottom wall and the sidewall of the fourth groove 80) whose deposition thickness is thicker is greater than an implantation dose in a region (to be specific, the bottom wall and the sidewall of the third groove 70) whose deposition thickness is thinner. The doses of ions implanted into the different positions or different deposition thicknesses of the initial filling layer are selectively changed, to help affect subsequent etching rates of the different positions of the initial filling layer.

Referring to FIG. 6, in some embodiments, the initial filling layer 61 is formed in the first groove 40 and the second groove 50 by using a chemical vapor deposition process or a physical vapor deposition process. A material of the initial filling layer 61 may include but is not limited to silicon oxide.

In the process of forming the initial filling layer 61 by using the deposition processes, the used chemical vapor deposition process or physical deposition process has uneven levels of step coverage, the deposition material forms overhangs at openings of the grooves, and an opening of a groove whose inner diameter is smaller is preferentially closed. Because the inner diameter of the second groove 50 is greater than the inner diameter of the first groove 40, a deposition thickness of the deposition material for forming the initial filling layer 61 on the sidewall and the bottom wall of the second groove 50 is greater than a deposition thickness on the sidewall and the bottom wall of the first groove 40. In addition, in the deposition process of the initial filling layer 61, deposition parameters (such as a deposition rate, deposition time, and particle deposition energy) of the deposition material used for forming the initial filling layer 61 may be controlled, such that a difference between the inner diameters of the third groove 70 and the fourth groove 80 that are formed after the deposition is decreased.

After the deposition is completed, the initial filling layer 61 deposited on a top surface of the mask structure 30 may be polished, to remove the initial filling layer 61 with an uneven thickness at an opening of the first groove 40 and an opening of the second groove 50, to ensure that when the opening of the first groove 40 is opened, the initial filling layer 61 located at the bottom wall and the sidewall of the first groove 40 and the bottom wall and the sidewall of the second groove 50 is exposed. In this case, the initial filling layer 61 is uniformly distributed on the bottom wall and the sidewall of the first groove 40 and the bottom wall and the sidewall of the second groove 50.

Referring to FIG. 6, in some embodiments, the thickness of the initial filling layer 61 is from 5 nm to 8 nm, for example, the thickness of the initial filling layer 81 is 5 nm, 5.5 nm, 6 nm, 6.5 nm, 7 nm, 7.5 nm, 8 nm, or the like.

In this embodiment, the initial filling layer with the thickness of 5 nm to 8 nm is formed, and the implantation doses of the ions in the group III elements or the group V elements are controlled in conjunction with types of the ions, such that the thickness of the initial filling layer deposited on the bottom wall and the sidewall of the second groove 50 is greater than the thickness of the initial filling layer deposited on the bottom wall and the sidewall of the first groove 40, thereby helping control the etching rates of the third groove 70 and the fourth groove 80 that are subsequently formed.

Referring to FIG. 2, in some embodiments, a material of the first dielectric layer 20 may include but is not limited to one of silicon oxynitride, silicon nitride, silicon oxide, silicon carbide, and a spin-coated hard mask layer. In some other embodiments, the material of the first dielectric layer 20 may further include undoped polycrystalline silicon. The first dielectric layer 20 is formed by depositing the foregoing deposition materials, and the initial filling layer 61 formed on the first dielectric layer 20 may be formed by depositing silicon oxide. That is, the first dielectric layer 20 and the initial filling layer 61 are formed by depositing different deposition materials. In a chemical vapor deposition process, a thickness of a material deposited at the step of the groove 31 is thicker than a thickness of a material deposited at the bottom of the groove 31. In this case, in a subsequent process of depositing the initial filling layer 61, the opening of the first groove 40 with a smaller inner diameter is preferentially closed, such that a deposition material of the initial filling layer 61 in the first groove 40 is fewer, and a deposition material, to be specific, a deposition material of the initial filling layer 61, in the second groove 50 with a larger inner diameter is more. Therefore, the thickness of the initial filling layer 61 deposited by using the deposition material for forming the initial filling layer 61 in the second groove 50 with a larger inner diameter is greater than the thickness of the initial filling layer 61 deposited in the first groove 40 with a smaller inner diameter.

After the initial filling layer 61 is formed, the initial filling layer 61 in the first groove 40 forms the third groove 70, and the initial filling layer 61 in the second groove 50 forms the fourth groove 80. The deposition thickness of the initial filling layer 61 in the fourth groove 80 is thicker, to enable the second difference between the fourth groove 80 and the third groove 70 to be less than the first difference, such that the etching rates of the different positions of the initial filling layer 61 are subsequently affected by ion implantation and RTP.

It should be noted that, parameters such as a deposition material, ion doping, and a deposition thickness are used in conjunction with each other, and after the third groove 70 and the fourth groove 80 are formed, an appropriate etching selectivity ratio is selected between the mask structure 30 and the filling layer 60, where the etching selectivity ratio ranges from 1:3 to 1:6, such that in a subsequent etching processing process, an etching rate of the filling layer 60 in the third groove 70 is faster and an etching rate of the filling layer 60 in the fourth groove 80 is slower. The following cases are included.

After the filling layer 60 in the third groove 70 is completely removed through etching, etching is stopped. In this case, the filling layer 60 in the fourth groove 80 is not completely removed, and the inner diameter of the fourth groove 80 is decreased due to the existence of the filling layer 60. In this case, if the inner diameter of the fourth groove 80 and the inner diameter of the third groove 70 from which the filling layer 60 is removed satisfy a preset difference, subsequent etching is performed by using the fourth groove 80 and the sidewall of the third groove 70 as a mask, to further ensure subsequent formation precision of a first through hole 130, a second through hole 140, and a contact hole 150 (referring to FIG. 11 to FIG. 13)

After the filling layer 60 of the fourth groove 80 is completed removed through etching, the filling layer 60 in the third groove 70 is already completely removed. In this case, the first dielectric layer 20 on a side of the third groove 70 is further etched and part of the first dielectric layer 20 is removed, to ensure that a plurality of etching openings 90 whose inner diameters have a preset difference are subsequently formed, thereby ensuring subsequent formation precision of the first through hole 130, the second through hole 140, and the contact hole 150 (referring to FIG. 11 to FIG. 13).

The etching openings 90 whose inner diameters have a preset difference specifically determine etching time of the third groove 70 and the fourth groove 80 according to a target size.

Referring to FIG. 2, in some embodiments, the base 10 may include a substrate 11 and a support structure 12 provided on the substrate 11. In this embodiment, the base 10 may be formed by using the following method.

The substrate 11 is provided, where the substrate 11 may be made of a semiconductor material. The semiconductor material may be one or more of silicon, germanium, silicon-germanium, and a silicon-carbon compound.

The support structure 12 is formed on a top surface of the substrate 11 by using an atomic layer deposition process, a physical vapor deposition process, or a chemical vapor deposition process. It should be noted that the support structure 12 may be a single-layer structure or a stacked structure. When the support structure 12 is a stacked structure, the support structure 12 may include a first support layer, a second support layer, and the like that are stacked. The support structure 12 may be configured to form through holes to be formed in a subsequent manufacturing process, where the through hole may include a contact hole configured to form a contact structure, a capacitor hole configured to form a capacitor structure, a bit line contact hole configured to form a bit line, and the like. After the through holes are formed, the support structure 12 provided around the through holes may be further configured to subsequently form another semiconductor structure between adjacent through holes, such as a bit line structure, a metal wire layer, or the like.

Referring to FIG. 2, in some embodiments, a plurality of isolation structures 111 provided at intervals may be provided in the substrate 11 along a first direction X.

A process of forming the isolation structure 111 may use the following method.

A photoresist layer (not shown in the figure) and a mask layer (not shown in the figure) that are stacked are deposited on a top surface of the substrate 11 by using an atomic layer deposition process, a physical vapor deposition process, or a chemical vapor deposition process. A mask pattern is formed on the photoresist layer through exposure or development etching. The photoresist layer with the mask pattern is used as a mask to etch and remove part of the photoresist layer and part of the mask layer. In this way, a plurality of isolation trenches (not shown in the figure) provided at intervals along the first direction X are formed on the substrate 11. Subsequently, the remaining photoresist layer and mask layer are removed through etching. Then, the isolation structure 111 is formed through deposition in the isolation trench by using the atomic layer deposition process, the physical vapor deposition process, or the chemical vapor deposition process. The substrate 11 between adjacent isolation structures 111 forms an active region 112. The isolation structure 111 may be made of an insulating material, such as silicon dioxide or silicon oxynitride. The plurality of isolation structures provided at intervals are used to form active regions provided at intervals on the substrate, to help subsequently form other structures connected to the active regions on the substrate, such as a capacitor contact, a source line contact, and a bit line contact.

Referring to FIG. 2, the support structure 12 is a stacked structure, where the support structure 12 may be formed by using the following method.

An isolation layer 121, a first sacrificial layer 122, at least one support layer 123, a second sacrificial layer 124, and an etching layer 125 that are sequentially stacked are formed on the substrate 11 by using the atomic layer deposition process, the physical vapor deposition process, or the chemical vapor deposition process. A material of the isolation layer 121 may include but is not limited to silicon nitride, materials of the first sacrificial layer 122 and the second sacrificial layer 124 may include but are not limited to silicon dioxide, and the etching layer 125 may include but is not limited to a spin-coated hard mask layer.

The support layer 123 includes a first support layer 1231 and a spin-coated hard mask layer 1232 that are alternately arranged. A material of the first support layer 1231 may include but is not limited to silicon oxynitride. In this example, there are two support layers 123, to be specific, the two support layers 123 are provided between the first sacrificial layer 122 and the second sacrificial layer 124. It should be noted that, in the two support layers 123, a thickness of an upper spin-coated hard mask layer 1232 may be equal to a thickness of a lower spin-coated hard mask layer 1232, or a thickness of an upper spin-coated hard mask layer 1232 is greater than or less than a thickness of a lower spin-coated hard mask layer 1232.

In this embodiment, stacked support structures are used, to precisely transfer etching sizes of etching openings onto the support structures in sequence, such that molding precision for subsequently forming other semiconductor structures (a bit line contact structure, a capacitor contact structure, and the like) in the support structures is improved, thereby improving a yield of the semiconductor structures.

Referring to FIG. 2 to FIG. 5, in some embodiments, the mask structure 30 may be formed by using the following method.

As shown in FIG. 2, after the etching layer 125 is formed, the first dielectric layer 20 is formed on the etching layer 125 by using the atomic layer deposition process, the physical vapor deposition process, or the chemical vapor deposition process.

Referring to FIG. 3 and FIG. 4, a first mask layer 100 is formed on the first dielectric layer 20 by still using the deposition processes.

Subsequently, a first mask pattern 101 is provided, and part of the first mask layer 100 is removed by using an etching processing process based on the first mask pattern 101, to form a plurality of initial grooves 102 on the first mask layer 100.

Part of the first dielectric layer 20 is removed by using the remaining part of the first mask layer 100 as a mask based on the initial grooves 102, to form the grooves 31 on the first dielectric layer 20. The initial grooves 102 may include a plurality of fifth grooves 110 and a plurality of sixth grooves 120, and an inner diameter of the fifth groove 110 is different from an inner diameter of the sixth groove 120 along the first direction X.

Then, part of the first dielectric layer 20 is removed based on the fifth groove 110 by using the etching processing process, to form the first groove 40 on the first dielectric layer 20. In addition, part of the first dielectric layer 20 is removed based on the sixth groove 120 by using the etching processing process, to form the second groove 50 on the first dielectric layer 20. The remaining part of the first dielectric layer 20 forms a plurality of mask structures 30 (referring to FIG. 5) provided at intervals along the first direction X.

In this embodiment, the first groove and the second groove can be quickly formed on the first dielectric layer by using the first mask pattern. A method is simple and is easily to operate.

Figure 11:
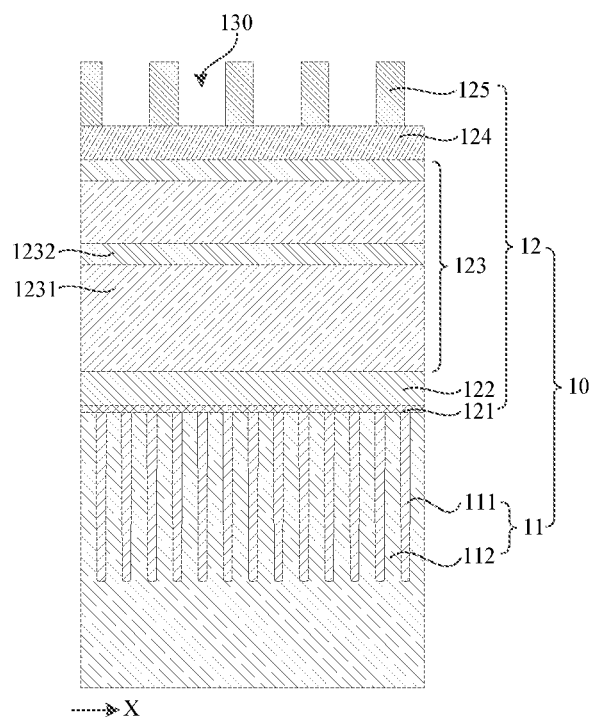
FIG. 11 is a schematic diagram of forming a first through hole in a method of manufacturing a semiconductor structure according to an exemplary embodiment.
Figure 12:
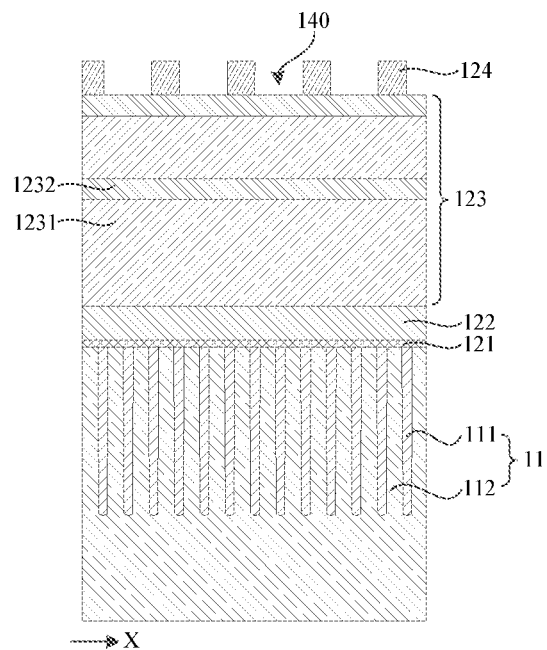
FIG. 12 is a schematic diagram of forming a second through hole in a method of manufacturing a semiconductor structure according to an exemplary embodiment.
Figure 13:
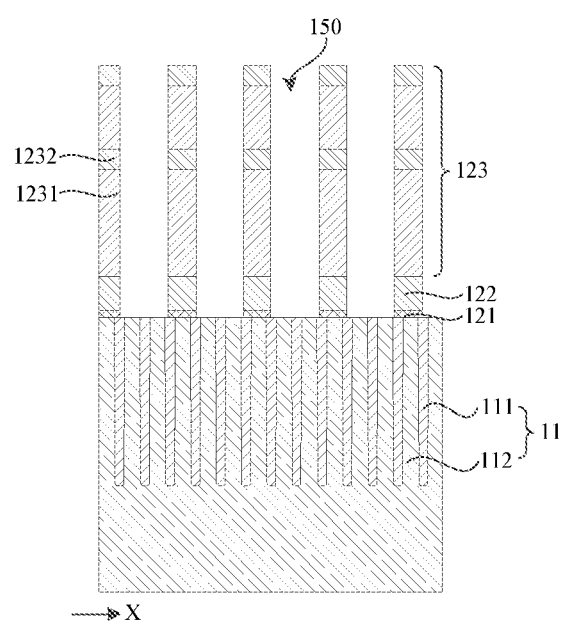
FIG. 13 is a schematic diagram of forming a contact hole in a method of manufacturing a semiconductor structure according to an exemplary embodiment.

Referring to FIG. 11 to FIG. 13, in some embodiments, the method of manufacturing a semiconductor structure includes:

As shown in FIG. 11, part of the etching layer 125 is removed by using the etching processing process based on etching openings 90 satisfying a target size requirement, to form a plurality of first through holes 130 arranged in an array in the etching layer 125. After the first through holes 130 are formed, the remaining part of the first dielectric layer 20 on the top of the etching layer 125 continues to be removed by using a polishing processing process.

As shown in FIG. 12, after the first dielectric layer 20 is removed, part of the second sacrificial layer 124 is removed by using the etching processing process based on the first through holes 130, to form a plurality of second through holes 140 arranged in an array in the second sacrificial layer 124. After the second through holes 140 are formed, the remaining part of the etching layer 125 continues to be removed by using the etching processing process.

As shown in FIG. 13, after the etching layer 125 is removed, part of the support structure 12 is removed by using the etching processing process based on the second through holes 140, to form a plurality of contact holes 150 arranged in an array in the support structure 12. The contact holes 150 expose at least part of the active region 112.

In this embodiment, the etching openings and the first through holes are used, to effectively improve formation precision of the second through holes, and further help subsequently form other semiconductor structures, such as a bit line contact structure and a capacitor contact structure, in the support structure.

As shown in FIG. 1, an exemplary embodiment of the present disclosure provides a semiconductor structure. The semiconductor structure may be manufactured by using the method of manufacturing a semiconductor structure according to any one of the foregoing embodiments. The semiconductor structure may be a DRAM, and certainly, the semiconductor structure may be further another structure.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A method of manufacturing a semiconductor structure, comprising:
providing a base;
forming a first dielectric layer on the base, wherein the first dielectric layer is provided with grooves arranged in an array, the grooves comprise a first groove and a second groove, and an inner diameter of the first groove and an inner diameter of the second groove have a first difference;
forming an initial filling layer, wherein the initial filling layer covers a sidewall and a bottom wall of the first groove and covers a sidewall and a bottom wall of the second groove, the initial filling layer in the first groove forms a third groove, the initial filling layer in the second groove forms a fourth groove, an inner diameter of the third groove and an inner diameter of the fourth groove have a second difference, and the second difference is less than the first difference;
processing the initial filling layer to form a filling layer; and
etching at least one of the filling layer or the first dielectric layer, to form a plurality of etching openings whose inner diameters have a preset difference on a surface of the base;
wherein the processing the initial filling layer to form a filling layer comprises:
performing ion implantation on the initial filling layer; and
performing rapid thermal processing on the initial filling layer after the ion implantation, to form the filling layer.

2. The method of manufacturing a semiconductor structure according to claim 1, wherein
the groove has a target size, the inner diameter of the first groove is less than the target size, and the inner diameter of the second groove is greater than the target size;

the target size is any value in a range of 30 nm to 60 nm; and the inner diameter of the first groove and the inner diameter of the second groove have a maximum difference of 6 nm.

3. The method of manufacturing a semiconductor structure according to claim 1, wherein the performing ion implantation on the initial filling layer comprises:

performing ion implantation on the initial filling layer by using a group III or group V element.

4. The method of manufacturing a semiconductor structure according to claim 3, wherein an ion implantation dose is between $10^{14}/cm^2$ and $10^{15}/cm^2$, and ion implantation energy is between 10 KeV and 40 KeV.

5. The method of manufacturing a semiconductor structure according to claim 1, wherein the forming an initial filling layer comprises:

forming the initial filling layer in the first groove and the second groove by using a chemical vapor deposition process or a physical vapor deposition process.

6. The method of manufacturing a semiconductor structure according to claim 5, wherein a thickness of the initial filling layer is from 5 nm to 8 nm.

7. The method of manufacturing a semiconductor structure according to claim 1, wherein a material of the first dielectric layer comprises one of silicon oxynitride, silicon nitride, silicon oxide, silicon carbide, and a spin-coated hard mask layer.

8. The method of manufacturing a semiconductor structure according to claim 1, wherein the first dielectric layer comprises undoped polysilicon.

9. The method of manufacturing a semiconductor structure according to claim 1, wherein the providing a base comprises:

providing a substrate; and forming a support structure on the substrate, wherein the support structure comprises:

an isolation layer, a first sacrificial layer, at least one support layer, a second sacrificial layer, and an etching layer that are formed and sequentially stacked on the substrate, and each support layer comprises a first support layer and a spin-coated hard mask layer that are alternately arranged.

10. The method of manufacturing a semiconductor structure according to claim 9, wherein the forming a first dielectric layer on the base, wherein the first dielectric layer is provided with grooves arranged in an array comprises:

forming the first dielectric layer on the etching layer;

forming a first mask layer on the first dielectric layer;

providing a first mask pattern, and removing part of the first mask layer based on the first mask pattern, to form a plurality of initial grooves on the first mask layer; and removing part of the first dielectric layer by using a remaining part of the first mask layer as a mask based on the initial grooves, to form the grooves on the first dielectric layer.

11. The method of manufacturing a semiconductor structure according to claim 10, further comprising:

removing part of the etching layer based on the etching openings, to form a plurality of first through holes arranged at intervals along a first direction in the etching layer.

12. The method of manufacturing a semiconductor structure according to claim 11, further comprising:

removing part of the second sacrificial layer based on the first through holes, to form a plurality of second through holes arranged at intervals along the first direction in the second sacrificial layer.

13. The method of manufacturing a semiconductor structure according to claim 12, further comprising:

forming, based on the second through holes, a plurality of contact holes arranged at intervals along the first direction in the support structure.

* * * * *